US011520381B2

(12) United States Patent
Eliyahu

(10) Patent No.: US 11,520,381 B2
(45) Date of Patent: Dec. 6, 2022

(54) ENCLOSING A PORTABLE SOLID STATE DEVICE

(71) Applicant: Nexark, Inc., Los Angeles, CA (US)

(72) Inventor: Menachem Eliyahu, Los Angeles, CA (US)

(73) Assignee: NEXARK, INC.

(*) Notice: Subject to any disclaimer, the term of this patent is extended or adjusted under 35 U.S.C. 154(b) by 0 days.

(21) Appl. No.: 17/249,977

(22) Filed: Mar. 19, 2021

(65) Prior Publication Data

US 2021/0294386 A1 Sep. 23, 2021

Related U.S. Application Data

(60) Provisional application No. 62/991,948, filed on Mar. 19, 2020.

(51) Int. Cl.

*G06F 1/16* (2006.01)
*G06F 1/18* (2006.01)
*H05K 5/02* (2006.01)

(52) U.S. Cl.

CPC ............ *G06F 1/1658* (2013.01); *G06F 1/181* (2013.01); *G06F 1/187* (2013.01); *H05K 5/0217* (2013.01); *H05K 5/0221* (2013.01)

(58) Field of Classification Search

CPC ........ G06F 1/181; G06F 1/187; G06F 1/1658; H05K 5/0208; H05K 5/026; H05K 5/0217; H05K 5/0221; H05K 5/0252

See application file for complete search history.

(56) References Cited

U.S. PATENT DOCUMENTS 7,517,252 B2 * 4/2009 Ni ........................ H05K 5/0256 439/630
8,531,845 B2 * 9/2013 Chen .................... H05K 5/0208 361/752
8,665,601 B1 * 3/2014 Mangay-Ayam, Jr. ...................... H05K 9/0066 361/728
9,552,848 B2 * 1/2017 Mangay-Ayam, Jr. ...................... H05K 1/144
9,829,933 B1 * 11/2017 Yang ....................... G06F 1/181
10,349,542 B2 * 7/2019 Chen ........................ G06F 1/185
10,929,327 B1 * 2/2021 Schrempp ............... G06F 1/185
2014/0111069 A1 * 4/2014 Chen ...................... G06F 1/1658 312/223.2
2019/0350095 A1 * 11/2019 Ding ...................... H05K 5/026

(Continued)

OTHER PUBLICATIONS

Dual Bay M.2 NVME SSD Enclosure, Offline Clone SSD Enclosure for M-Key and B&M-Key NVME PCIe 2230/2242/2260/2280 SSDs, USB 3.1 Gen2 10Gbps External Aluminum Enclosure NVMe Hard Drive Reader, Tool-Free by Rocketek (Year: Mar. 9, 2020).*

*Primary Examiner* — Nidhi Thaker
(74) *Attorney, Agent, or Firm* — Hall Estill Law Firm

(57) ABSTRACT

Apparatus and associated methodology contemplating an enclosure apparatus for a solid-state device (SSD). The apparatus includes a rigid case having a wall defining an internal cavity. A surface in the wall defines one of a recess or a protuberant tab exposed to the internal cavity. A cover is configured to connect with the case in a closed position in which the cover and the case are connected together to cooperatively enclose the internal cavity. The cover defines the other of the recess or the tab, the tab sized to be removably insertable into the recess to form an articulable joint connecting the cover and the case together in the closed position.

10 Claims, 12 Drawing Sheets

(56) References Cited

U.S. PATENT DOCUMENTS

2020/0260602 A1* 8/2020 Gao .................. H05K 7/20418
2020/0371568 A1* 11/2020 Xiong ..................... G06F 1/181

* cited by examiner

ENCLOSING A PORTABLE SOLID STATE DEVICE

RELATED APPLICATION

The present application claims priority to U.S. Provisional Patent Application No. 62/991,948 filed Mar. 19, 2020, the contents of which is hereby incorporated by reference.

BACKGROUND

In enterprise data centers and industrial applications that demand high speed data access, solid-state drives (or more generally "solid-state devices" ("SSDs") are increasingly becoming the data storage of choice. These data storage and access systems typically protect the data integrity through regular and repeated replication. That is, by periodically copying the organization's business site data to a redundant backup storage system, and continuously updating historical data with the changes. The backup storage system may be situated in the same physical location as the primary storage system, or in a physically remote location.

One such example is a distributed storage system. A distributed storage system typically includes a large array of data storage devices, usually hard disk drives. The historical snapshots of data and the incremental data updates are allocated to stripes of storage capacity in a selected redundant array of independent disk (RAID) format. The updates to historical data can occur periodically, or they can occur as changes are made to the data. By providing continuous data protection, the business organization is able to roll back to any specified point in time within a predetermined recent history.

Utilizing a conventional distributed storage system has typically required a significant financial investment in the large arrays of hard disk drives and the refrigeration systems to keep them cool during operation. Modern SSD technology, on the other hand, is enabling cost and miniaturization improvements making SSDs feasible and cost-competitive with existing enterprise storage system technology.

One such new technology is the non-volatile memory express (NVMe) technology for accessing solid-state devices (SSDs) and other target devices attached through a peripheral component interconnect express (PCIe) bus. Improvements are needed in the ways these SSDs are used individually, or in groups, in a portable electronic device. It is to those improvements that embodiments of the present technology are directed.

SUMMARY

Some embodiments of this technology contemplate an enclosure apparatus for a solid-state device (SSD). The apparatus includes a rigid case having a wall defining an internal cavity. A surface in the wall defines one of a recess or a protuberant tab exposed to the internal cavity. A cover is configured to connect with the case in a closed position in which the cover and the case are connected together to cooperatively enclose the internal cavity. The cover defines the other of the recess or the tab, the tab sized to be removably insertable into the recess to form an articulable joint connecting the cover and the case together in the closed position.

Some embodiments of this technology contemplate an enclosure apparatus for a solid-state device (SSD). The apparatus includes a rigid case having a wall defining an internal cavity. First surfaces forming the internal cavity define one of a recess or a protuberant tab, and second surfaces forming the internal cavity define a mounting feature for the SSD. A cover is configured to connect with the case in a closed position in which the cover and the case are connected together to cooperatively enclose the internal cavity. The cover has the other of the recess or tab, the tab sized to be removably insertable into the recess to form an articulable joint connecting the cover and the case together in the closed position.

Some embodiments of this technology contemplate an enclosure apparatus for a solid-state device (SSD). The enclosure has a heat exchanger body having a first surface and an opposing second surface. A heat exchanger coil is at least partially embedded in the body. The coil extends beyond the first surface and is configured so that, mounting the enclosure's first surface near the SSD establishes a path of thermal conductivity through which the SSD first conducts heat from the SSD to the coil, and then conducts the heat from the coil to the body.

BRIEF DESCRIPTION OF THE DRAWINGS

Details of various embodiments of the present technology are described in connection with the accompanying drawings that bear similar reference numerals for similar components.

DESCRIPTION

Initially, this disclosure is by way of example only, not by limitation. The illustrative constructions and associated methods disclosed herein are not limited to use or application for any specific system or in any specific environment. That is, the disclosed technology is not limited to usage for solid state drives as illustratively disclosed herein. Thus, although the instrumentalities described herein are for the convenience of explanation, shown and described with respect to exemplary embodiments, the skilled artisan understands that the principles herein may be applied equally in other types of portable digital data devices.

Figure 1:
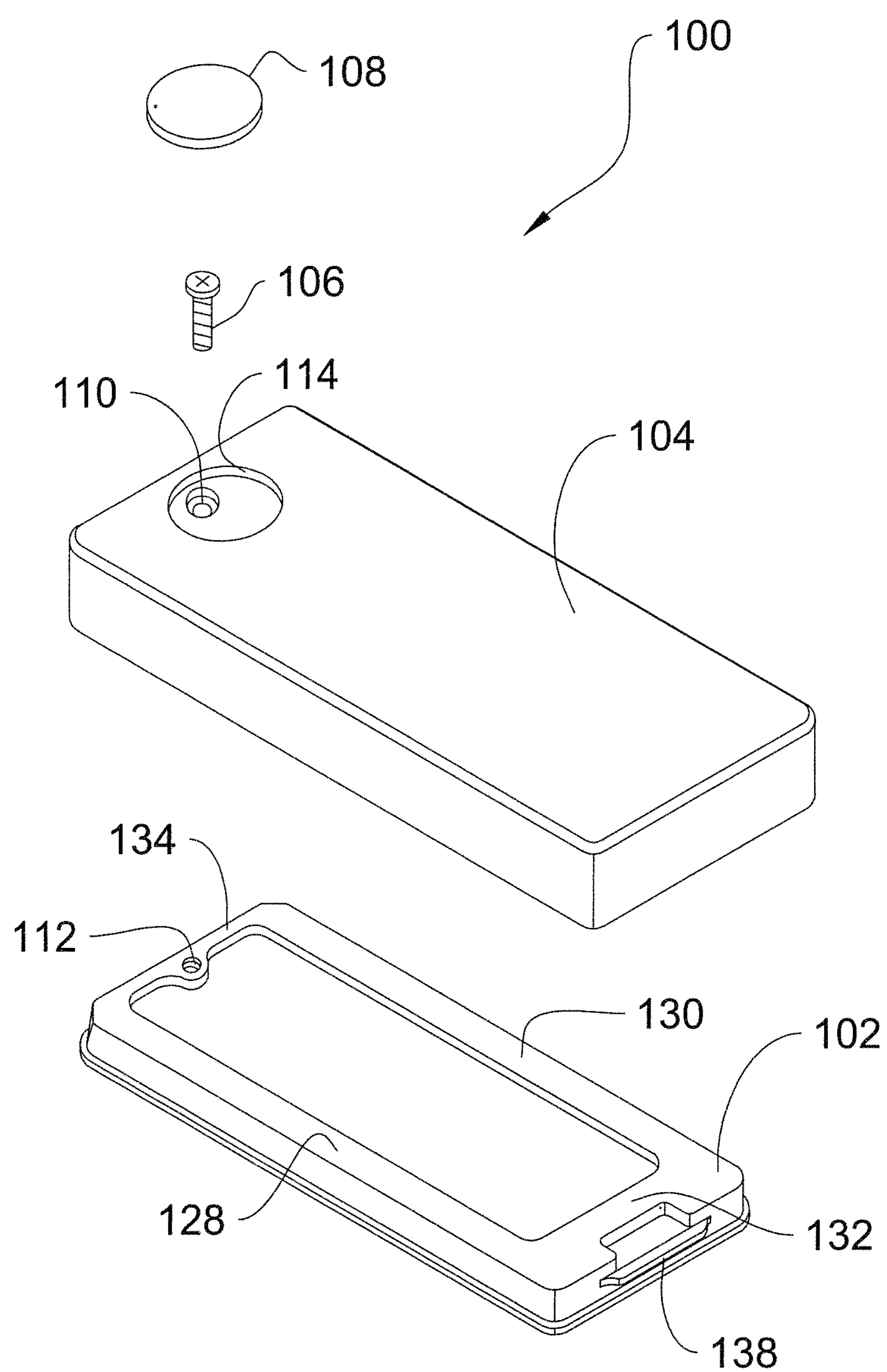
FIG. 1 is an exploded isometric depiction of an enclosure constructed in accordance with illustrative embodiments of the present technology.

The present technology is directed to improvements in enclosing a digital electronic solid state device ("SSD"), such as solid state drive in some illustrative embodiments described herein. FIG. 1 is an isometric depiction of an enclosure 100 constructed in accordance with illustrative embodiments of the present technology. The enclosure 100 in these illustrative embodiments is constructed of a cover 102 and a case 104 that cooperatively enclose an internal cavity sized to contain a desired electronics device, such as an SSD in the illustrative embodiments of this detailed description.

The cover 102 and case 104 are generally constructed of a rigid material to provide adequate structural integrity that protects the contents of the enclosure 100 from damage during handling and usage. Furthermore, the cover 102 and case 104 can advantageously be constructed of materials that have significant thermal conductivity properties in order to draw heat away from the SSD during its operation. For example, in illustrative embodiments the cover 102 and case 104 can be constructed of metallic materials such as aluminum. In those instances, they can be manufactured by forming processes, such as molding and sintering and the like, with machining processes as necessary. Alternatively, forming can be done with no machining operations in other illustrative embodiments in which the cover 102 and case 104 are constructed of polymeric materials with thermally-conductive ingredients.

The cover 102 is selectively removeable from the case 104 to provide access to the internal cavity of the enclosure 100. In the illustrative embodiments of FIG. 1, a tamper-resistant arrangement is provided to control access to the SSD and other electronics in the internal cavity. The enclosure 100 in FIG. 1 includes a removable fastener 106 covered by a seal 108. In these illustrative embodiments the fastener 106 is a threaded fastener, but the contemplated embodiments are not so limited.

The cover 104 defines a through-opening 110 sized to admit the threaded shank portion of the fastener 106 in a clearance relationship. The cover 102 defines a corresponding threaded opening 112 that is configured to receivingly engage a distal end of the fastener 106 in a threading relationship. With the cover 102 and the case 104 brought together in the closed position, the fastener 106 can be passed through the clearance opening 110 in the case 104 to threadingly engage the threaded-opening 112 in the cover 102. The fastener 106 can then be threadingly advanced to connect the cover 102 and the case 104 together. The through opening 110 can form a recess, such as a counterbore or a countersink and the like, so that the head portion of the fastener 106 is flush mounted when the cover 102 and case 104 are connected together. In equivalent alternative embodiments, the clearance hole can be formed by the cover and the threaded hold can be formed in the case.

The cover 104 in these illustrative embodiments also defines another recess 114 that is sized to receivingly engage the seal 108. In these illustrative embodiments, the seal 108 is a round disk and the recess 114 defines a corresponding counterbore, although the contemplated embodiments are not so limited. After the cover 102 is connected to the base 104 by advancing the fastener 106, an adhesive (not depicted) can be applied between the seal 108 and the cover 104. The seal 108 is then disposed into the recess 114 and adhered to the cover 104. Registration features can be provided in the cover 104 and the seal 108 to positively orient the seal 108 at a desired rotational position, such as when the seal 108 bears the organization's name or logo on its exposed surface.

The adhered seal 108 guards access to the fastener 106, such that the cover 102 cannot be disconnected from the case 104 without first removing the adhered seal 108. The seal 108 is purposefully made thin enough that it cannot be removed from its adhesion to the case 104 without sustaining visible distortion. This construction provides a way of reliably detecting that the user has at least tried to access the electronics inside the enclosure 100. That is valuable information when it comes to allocating repair and warranty costs on those electronics components and assemblies.

Figure 2:
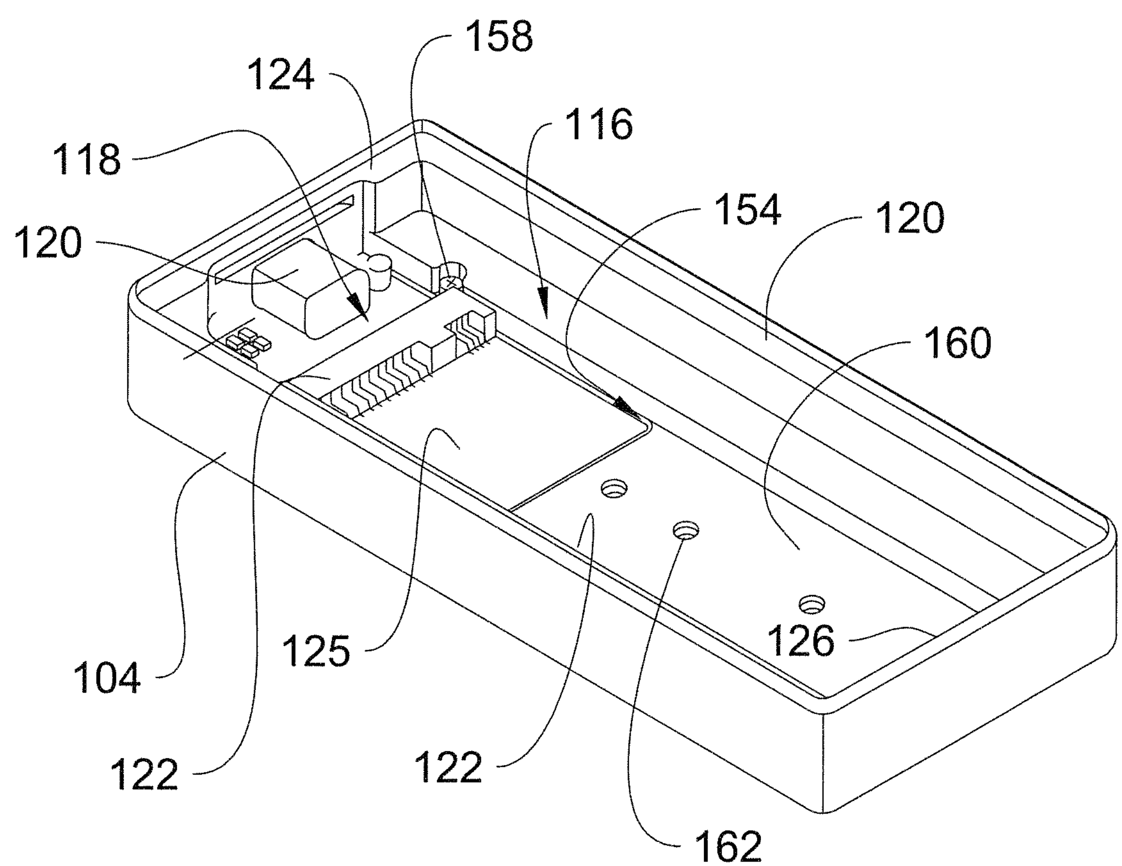
FIG. 2 is an enlarged depiction of another perspective of the case portion of the enclosure in FIG. 1.

Staying with FIG. 1 and further considering FIG. 2, an enlarged depiction of the case 104 in FIG. 1 from a different perspective. FIG. 2 reveals the internal cavity 116 mentioned above. An SSD interface 118 is installed in the internal cavity 116, having an external electrical connector 120, an internal electrical connector 122, and a plurality of integrated circuit components all attached to and interconnected via a printed circuit board 125. The external electrical connector 120 is externally accessible via a slot 126 (see FIG. 4) through an endwall of the case 104.

Staying with FIGS. 1 and 2, the case 104 defines a set of closure surfaces 120-126 that are associated with closing the internal cavity 116 to enclose the SSD interface 118 (and other electronics) inside the internal cavity 116. The opposing sidewall closure surfaces 120, 122 are joined by opposing endwall closure surfaces 124, 126. The cover 102 likewise defines a set of closure surfaces 128-134 that are sized and arranged to contact against the case's closure surfaces 120-126 in the closed position, where the cover 102 and base 104 together cooperatively enclose the internal cavity 116 and its contents.

Figure 3A:
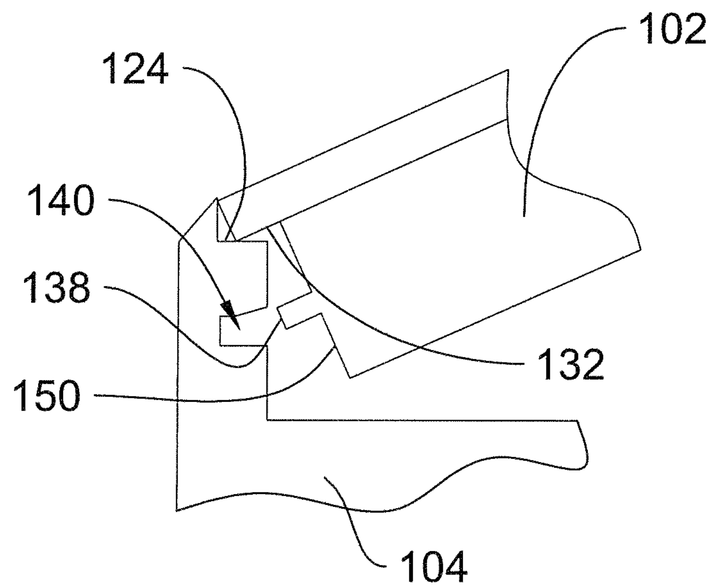
FIGS. 3A-3C diagrammatically depict the articulable joint connecting the cover to the case in the enclosure of FIG. 1.
Figure 3B:
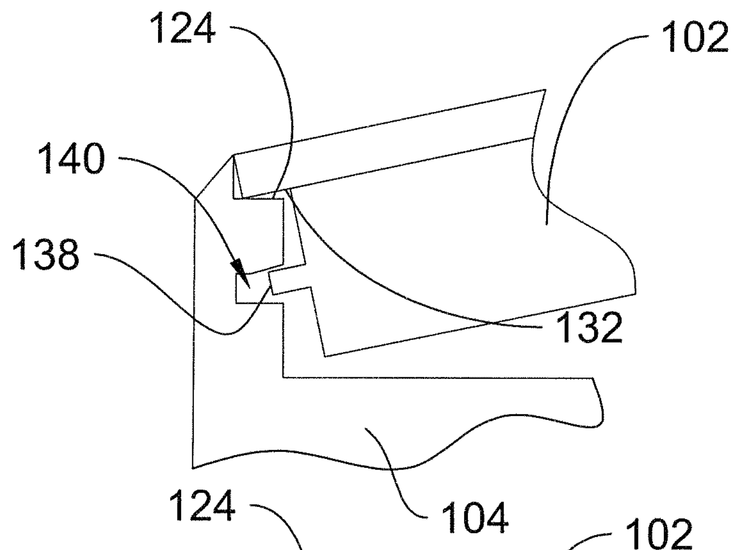
Figure 3C:
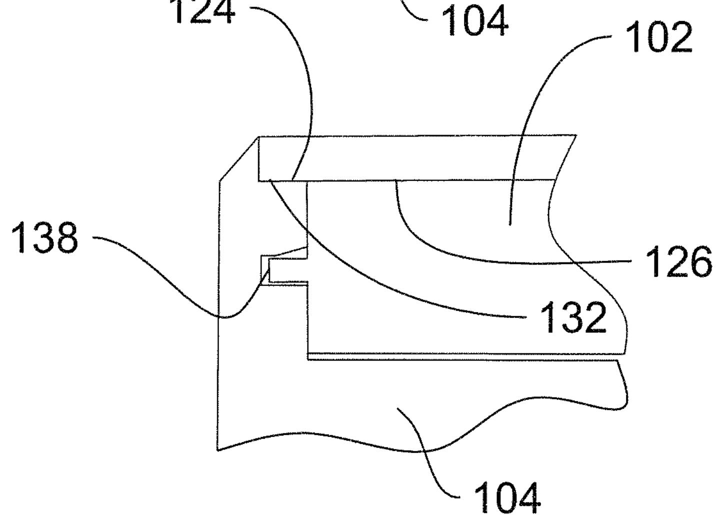

In addition to using the removable fastener 106 at one end, FIGS. 3A-3C diagrammatically depict how the cover 102 and the base 104 are connected together at the other end without using a removable fastener. Generally speaking, here the cover 102 and the case 104 are interlocked together and then progressively rotated toward each other to a closed position where they cooperatively enclose the internal cavity 116. The progression begins, as depicted by FIG. 3A, by angling the cover 102 and lowering it so that its reference closure surface 132 makes contact with the case's reference closure surface 124. That contact of the reference surfaces 124, 132 brings some interlocking features into alignment with each other. In these illustrative embodiments, the cover 102 has an upstanding edge 150 effectively defining the thickness of the cover 102. In these illustrative embodiments, a protuberant tab 138 extends from the upstanding edge 150. The tab 138 has been brought into rotational alignment with a slot 140 formed in the case 104. The tab 138 is sized to be removably insertable into the slot 140 in a sliding relationship.

FIG. 3B depicts lowering the cover 102 a bit while the reference closure surfaces 124, 132 remain in contacting engagement with each other. This causes the tab 138 to enter into the slot 140. FIG. 3C depicts the closed enclosure 100, where all of the cover's closure surfaces and all of the case's closure surfaces are in facing contact with each other. The tab 138 and the slot 140 in these illustrative embodiments form an articulable joint connecting the cover 102 and the case 104 together in the closed enclosure 100. The term "articulable," for purposes of this description and the claims, means "selectively rotational." That is, generally speaking, the present technology contemplates the cover 102 and the case 104 having interlocking features that are brought into rotational alignment by placing the cover 102 and the case 104 in contact with each other. The interlocking features join the cover 102 and the case 104 together throughout various selected rotational orientations. That is, the interlocking features cooperatively form a joint that operates at selected rotations; the joint is selectively rotational. Advantageously, this arrangement provides a fastener-free way of securing these ends of the cover 102 and case 104 together. Although these illustrative embodiments depict the cover 102 having the tab 138 and the case 104 forming the slot 140, the contemplated embodiments are not so limited. In equivalent alternative embodiments, the cover can form a recess and the case can form the tab. The interlocking features can also be constructed of other interlocking shapes, and can be formed by other surfaces of the cover 102 and the case 104.

FIG. 2 also depicts a number mounting features are provided in the internal surface of the case 104 to securely mount the electronics components in the internal cavity 116. The various mounting features of these illustrative embodiments are designed to protect the interconnected electronics components from the harsh handling conditions of a portable digital device. One of the mounting features depicted in these illustrative embodiments is a recess 154 in the internal cavity 116. FIG. 2 depicts the printed circuit board 125 in the recess 154, whereas the recess 154 is empty in FIG. 4. The recess 154 is configured to form a close mating relationship with the peripheral shape of the printed circuit board 125. Placing the printed circuit board 125 in the closely conforming recess 154 reliably positions the entire printed circuit board assembly in the internal cavity 116. Namely, the external connector 120 is properly positioned with respect to the slot 126 (see FIG. 4) in the case 104. Likewise, the internal connector 122 is properly positioned for connecting to the SSD 156 (see FIG. 4). One or more fasteners 158 provide hold down forces to retain the printed circuit board 125 in the recess 154, and to oppose insertion forces applied against the connectors 120, 122 when the user connects things to them.

Figure 4:
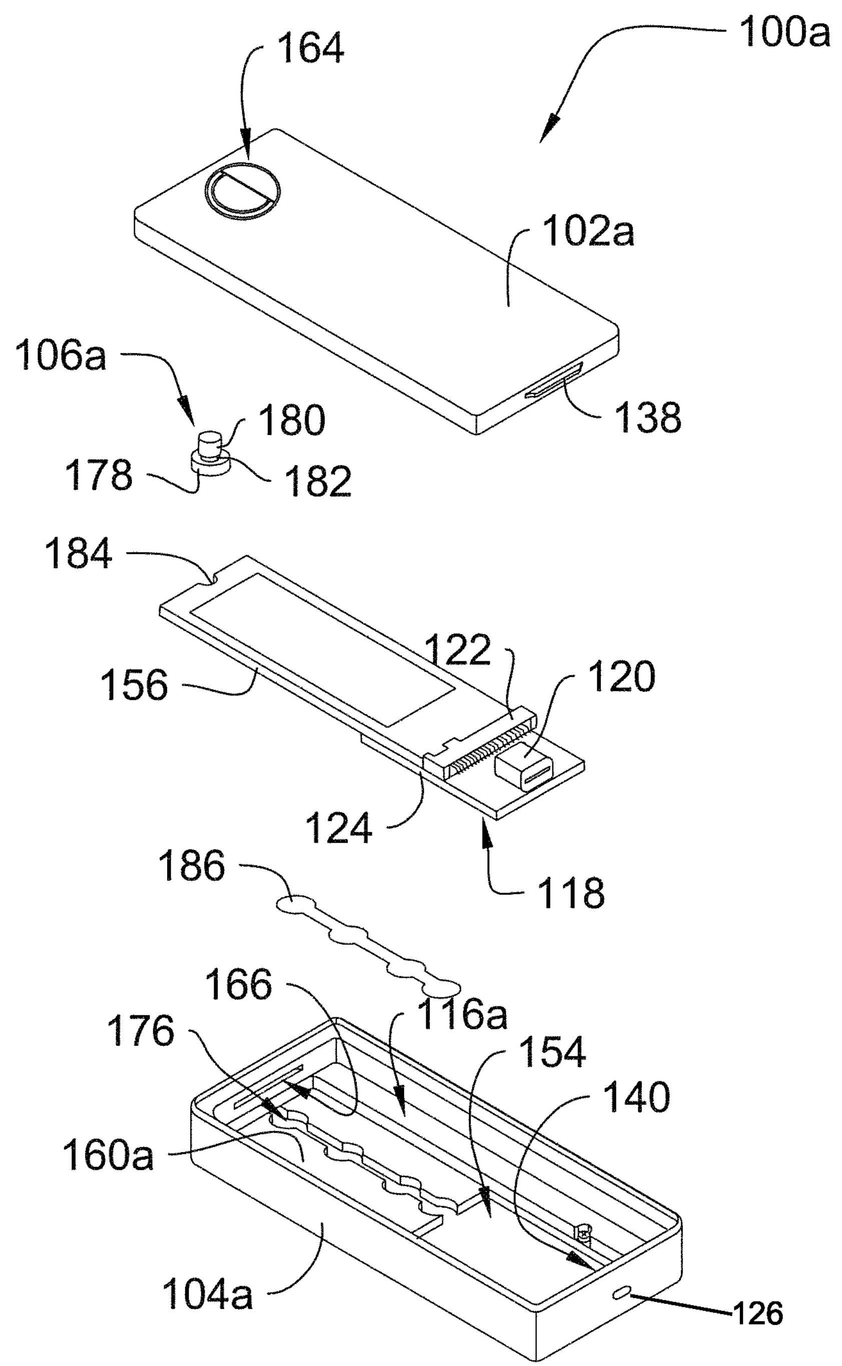
FIG. 4 is an exploded isometric depiction of an enclosure constructed in accordance with alternative embodiments of the present technology.

Another mounting feature depicted in these illustrative embodiments is a planar support surface 160 for supporting the distal end of the SSD 156 (FIG. 4) while its proximal end is operably connected to the internal connector 122. Yet another mounting feature is an opening 162 in the support surface 160 that serves as an anchor point for securing the distal end of the SSD 156 (FIG. 4). Two or more of the openings 162 can be provided to mount SSDs 156 (FIG. 4) of different lengths. In these illustrative embodiments, the openings 162 are internally threaded to receive a threaded fastener, although the contemplated embodiments of the present technology are not so limited.

FIG. 4 is an exploded isometric depiction of an enclosure 100*a* constructed in accordance with alternative embodiments of the present technology. The cover 102*a* and case 104*a* are connected together at one end of the enclosure 100*a* in the fastenerless, articulable joint described above. Namely, the cover 102*a* has the protuberant tab 138 and the cover 104*a* has the recess 140 in the interior surface of the endwall of the case 104*a* (hidden from view in FIG. 4). These interlocking members are selectively interconnectable to form the articulable joint connecting the cover 102*a* and the case 104*a* together. At the other end of the enclosure 100*a*, the cover 102*a* and the case 104*a* are connected together by a latch.

Figure 5:
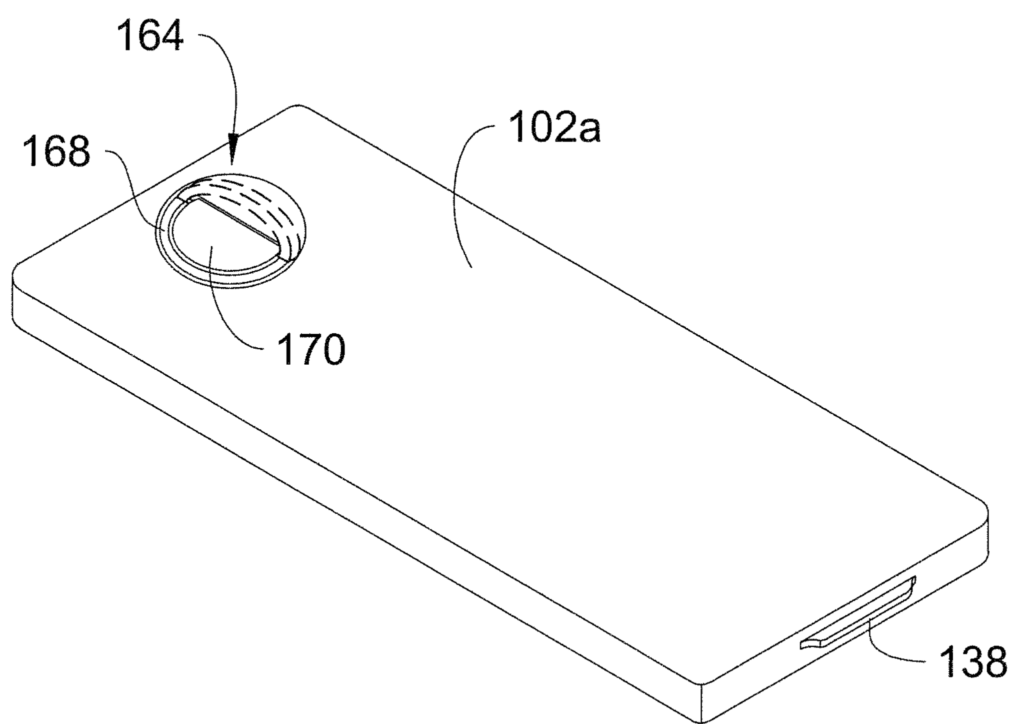
FIG. 5 is an enlarged depiction of the cover portion of the enclosure in FIG. 4.

In these illustrative embodiments, the cover 102*a* has a latch 164 that cooperates with another recess 166 in the opposing endwall of the case 104*a* to connect the cover 102*a* and the case 104*a* together. FIG. 5 depicts an enlarged view of the cover 102*a*, more particularly showing the latch 164 has a handle 168 configured to assist the user in rotating a shaft 170. The handle 168 is pinned to the shaft 170 so as to be selectively pivotable between a retracted position (shown by solid lines) and an extended position (shown by broken lines). Putting the handle 168 in the extended position affords the user a grip to aid in selectively rotating the shaft 170 and, in turn, latching the cover 102*a* (connected to the case 104*a*) and unlatching the cover 102*a* (disconnected from the case 104*a*).

Figure 6A:
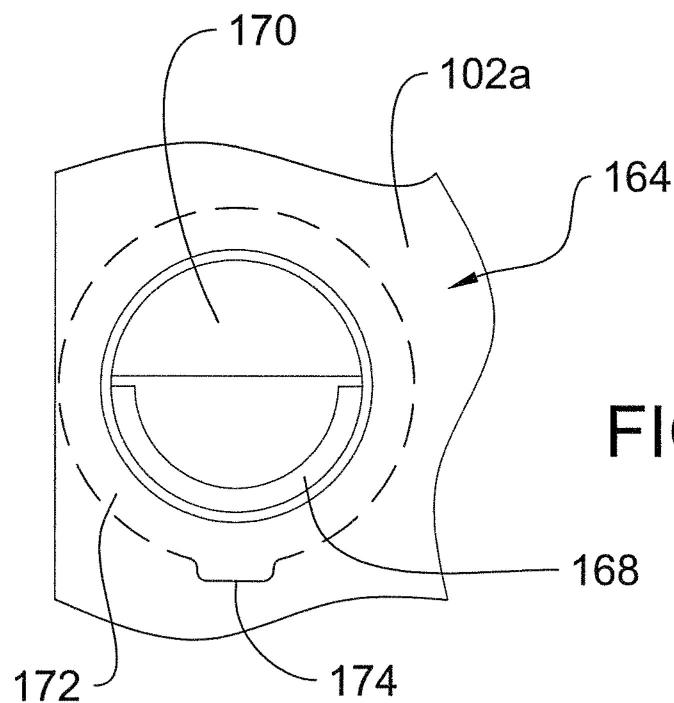
FIGS. 6A-6B diagrammatically depict the latch portion of the cover in FIG. 5, in the unlatched position.
Figure 6B:
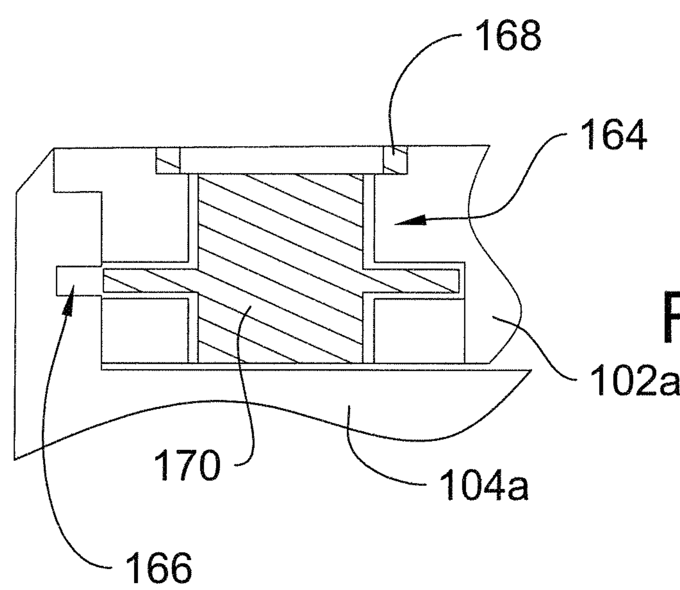
Figure 7A:
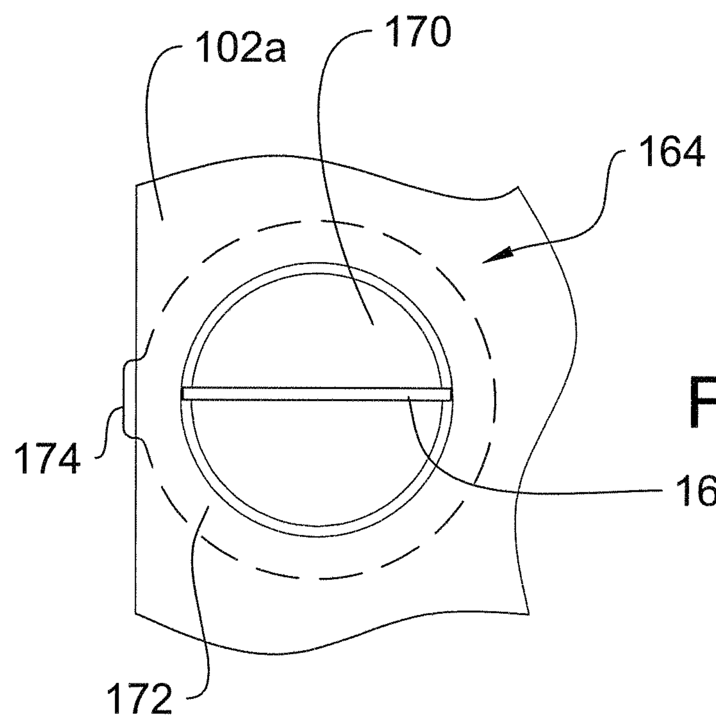
FIGS. 7A-7B diagrammatically depict the latch portion of the cover in FIG. 5, in the latched position.
Figure 7B:
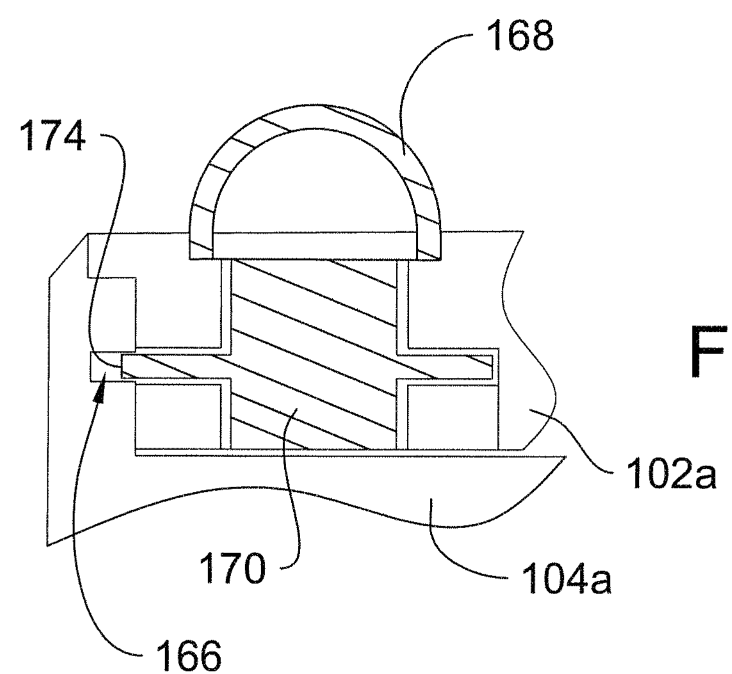

FIGS. 6A and 6B depict top and partial cross sectional views, respectively, of the latch 164 of these illustrative embodiments in the unlatched mode and with the handle 168 in the retracted position. The shaft 170 supports a cam 172 inside the cover 102*a* that forms a protuberant tab 174. In the unlatched rotational position, depicted in FIG. 6A, the cam 172 is entirely contained within the outer periphery of the cover 102*a*. In comparison, FIGS. 7A and 7B depict the latched rotational position with the handle 168 in the extended position. The extended handle 168 has been used to rotate the shaft 170, and thus the cam 172 and its protuberant tab 174, one-quarter (¼) of a revolution. With the cover 102*a* and the case 104*a* together in the closed position, the tab 174 extends beyond the outer periphery of the cover 102*a* and into the recess 166 formed in the case 104*a*. This interference fit of the tab 174 extending into the recess 166 prevents removal of the cover 102*a*, thereby connecting this end of the cover 102*a* and the case 104*a* together. Although the latch 164 in these illustrative embodiments is constructed as a quarter-turn latch, the contemplated embodiments as claimed are not so limited.

Returning to the illustrative embodiments of FIG. 4, the case 104*a* depicts alternative embodiments of the mounting features of the claimed technology. Here, the planar surface 160*a* forms an elongated central recess 176 defining a number of discrete circular openings. A fastener 106*a* has a magnet 178 portion and a post 180 extending therefrom. A notch 182 is formed in the post 180, sized to be receivingly engaged in a notch 184 formed at the distal end of the SSD 156. The fastener's magnet 178 is sized to enter any of the circular portions of the recess 176 in the floor of the case's internal cavity 116*a*. The fastener 106*a* is retained in the selected circular portion by the magnetic attraction between the magnet 178 and the case 104*a*. If the case 104*a* is constructed of a non-magnetic material, such as aluminum, polymer, and the like, then a strip 186 of ferromagnetic material (such as iron, nickel, cobalt alloys) can be adhered to the case 104 inside the recess 176.

Figure 8:
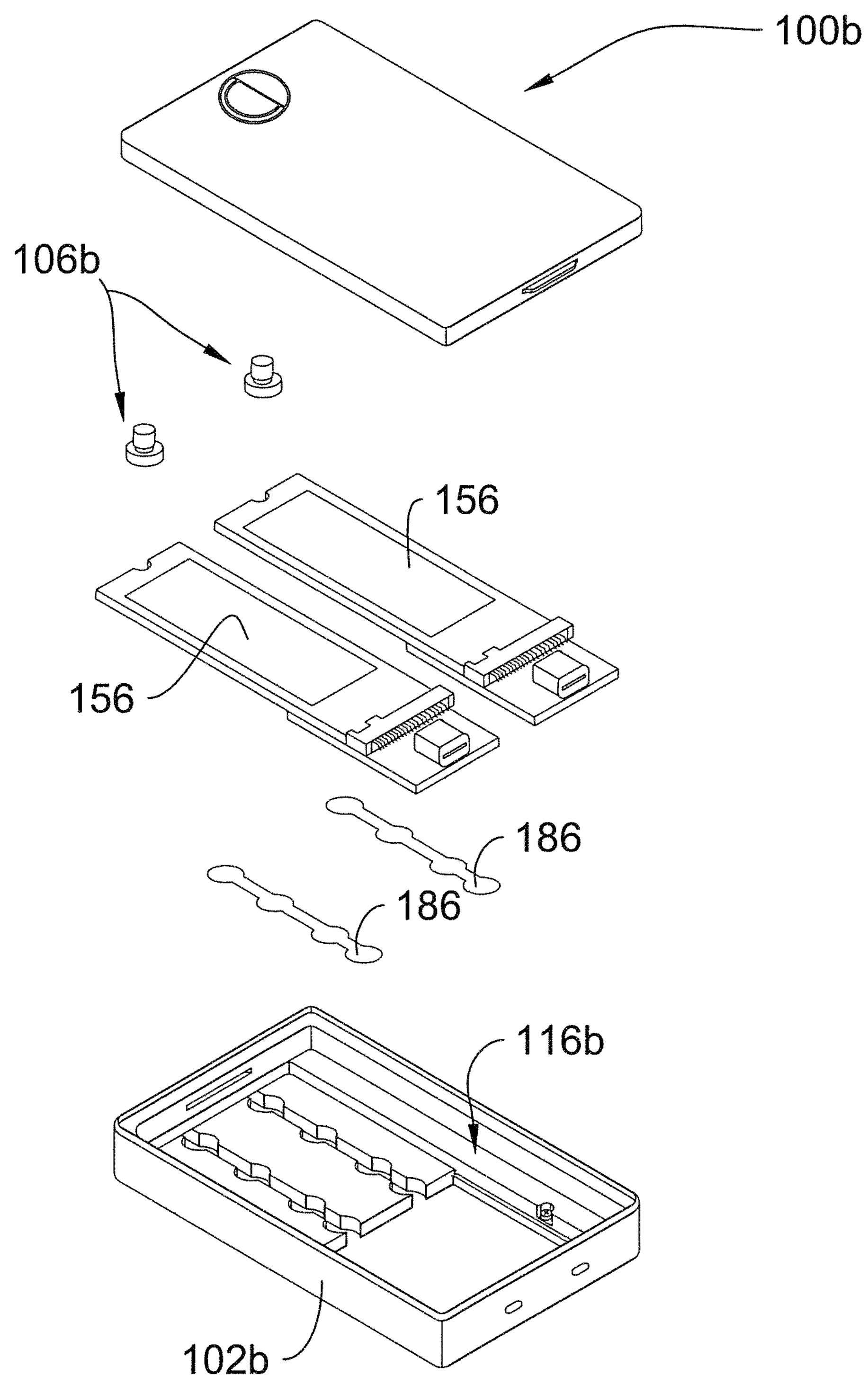
FIG. 8 is an exploded isometric depiction of an enclosure constructed in accordance with other alternative embodiments of the present technology.

FIG. 8 depicts yet further contemplated embodiments of an SSD enclosure 100*b* constructed in accordance with the claimed technology. The enclosure 100*b* is similar to the embodiments depicts in FIG. 4, but with the internal cavity 116*b* having mounting features for accommodating two SSDs 156 instead of just one. This enclosure 100*b* offers additional benefits to those described above. For instance, having two SSDs 156 in the enclosure 100*b* can significantly increase the data storage capacity of the portable data storage device of this technology if both SSDs 156 are allocated to store the user's data. Furthermore, the embodiments of FIG. 8 can be employed to transfer data from one SSD 156 to another one. This is particularly advantageous for making a duplicate data copy of an entire SSD 156, or in other words cloning the SSD 156.

Figure 9:
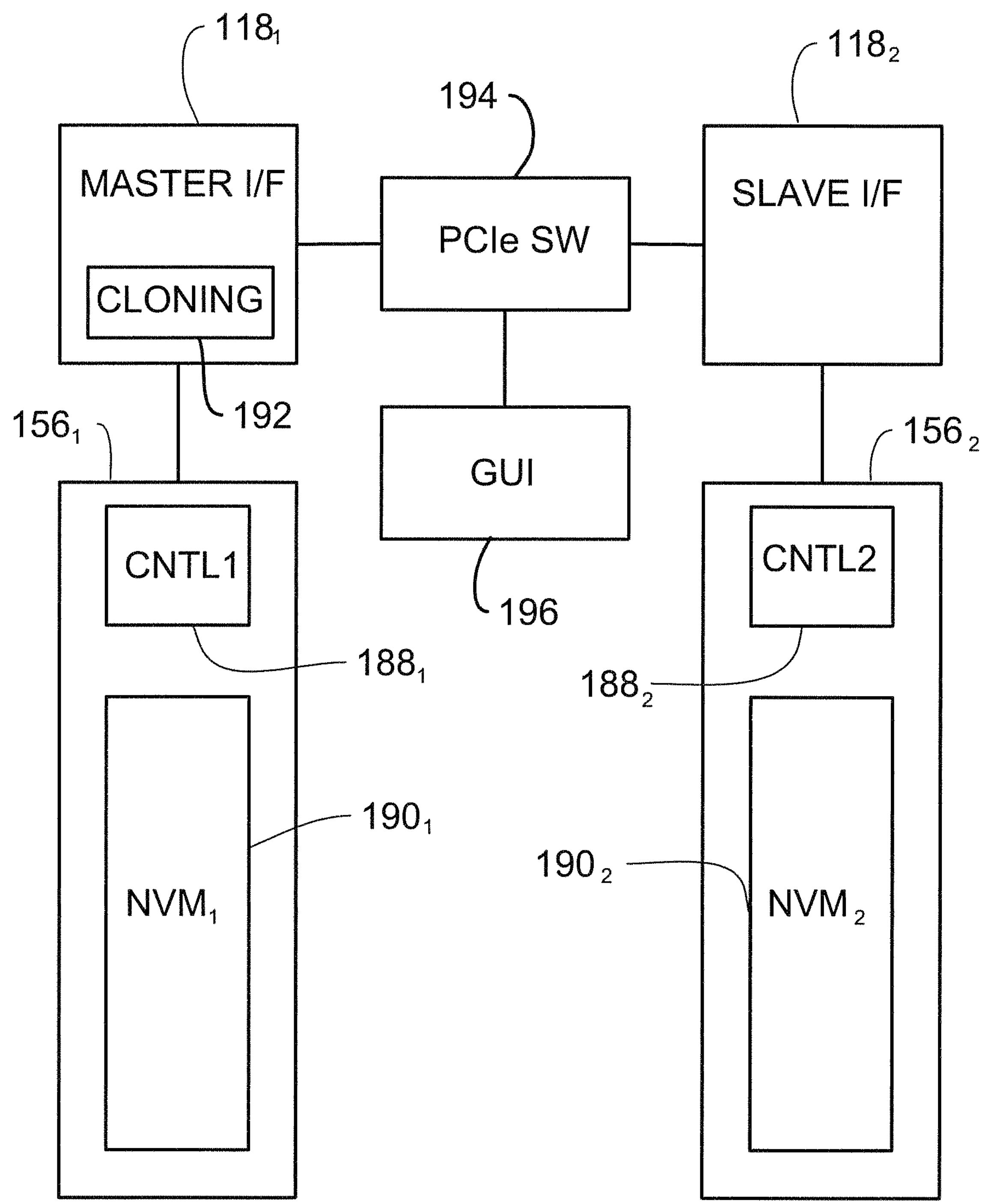
FIG. 9 is an illustrative block diagram of the SSD and SSD interface in accordance with illustrative embodiments of the present technology.

FIG. 9 is an illustrative block diagram of the dual-SSD embodiments of FIG. 8. In these illustrative embodiments, one of the two SSD interfaces $\mathbf{118}_1$ is designated as the master for controlling a process of cloning the SSD 156$_1$ connected to it. Thus, the other SSD interface 118$_2$ is subject to the control of the master SSD interface 118$_1$ in the process of creating a clone in the SSD 156$_2$ connected to it. Each of the SSDs 156 includes a data transfer controller 188 and non-volatile memory 190, such as flash memory modules. In these illustrative embodiments, a cloning application 192 resides in the master SSD interface 118$_1$. The cloning application 192 includes computer instructions stored in memory and executable by a processor to perform steps in a process of cloning data stored in the master SSD 156$_1$. Although the cloning application 192 resides in the master SSD interface 118$_1$ in these illustrative embodiments, the claimed embodiments are not so limited. In alterative equivalent embodiments the cloning application 192 can reside elsewhere, internal or external to the enclosure 100*b*.

The SSD interfaces 118 are interconnected for purposes of transferring data from the master SSD 156$_1$ to the slave SSD 156$_2$, such as via a PCIe switch 194 in these illustrative embodiments. A graphical user interface ("GUI") 196 can be provided for facilitating the user's initiation and control of the cloning procedure.

Figure 10:
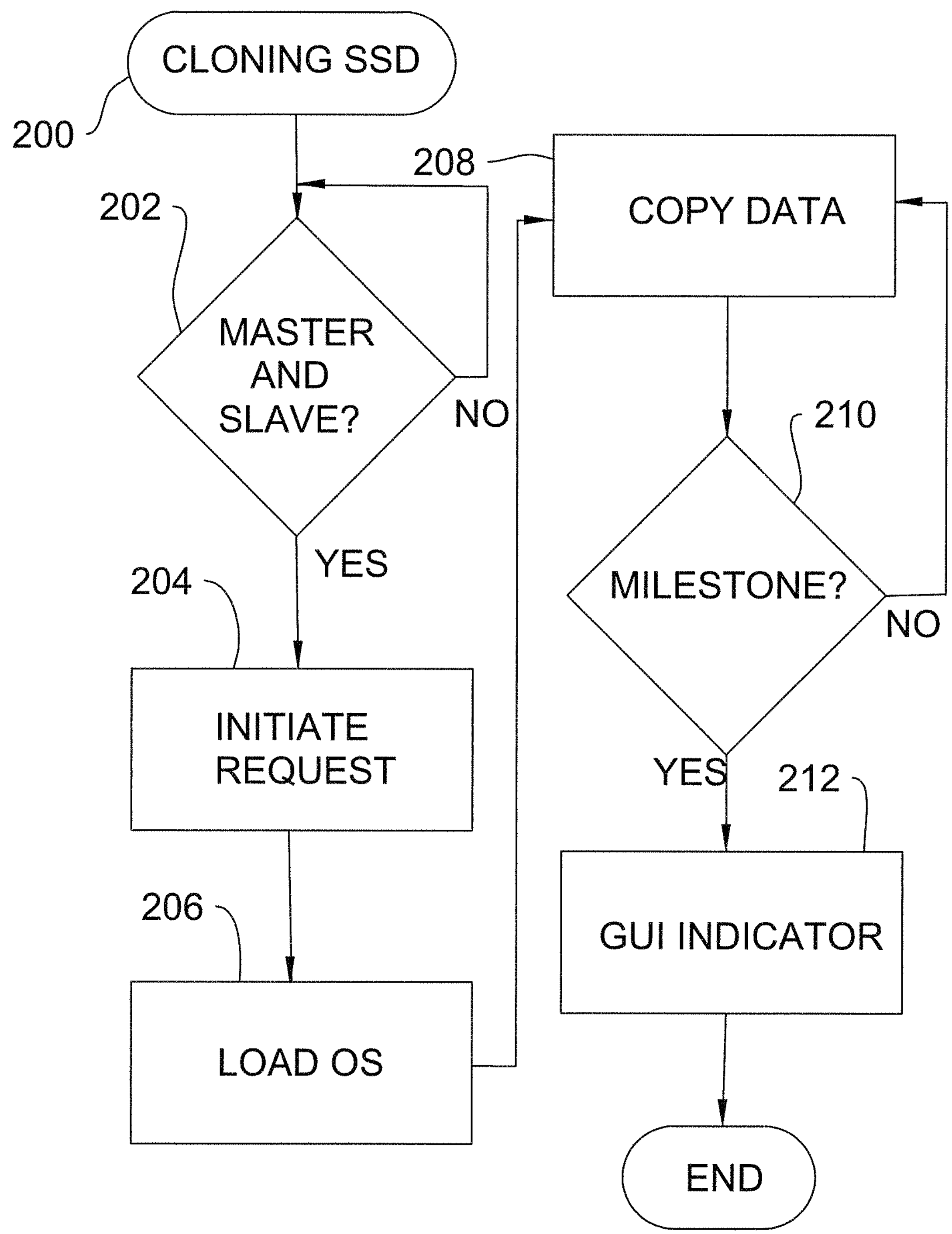
FIG. 10 depicts a flowchart of steps in a method for SSD CLONING in accordance with illustrative embodiments of the present technology.

FIG. 10 depicts a flowchart of illustrative steps in a method for CLONING AN SSD in accordance with illustrative embodiments of the cloning application 192. The method 200 begins in block 202 with the determination of whether both master and slave SSDs have been connected to their respective SSD interfaces. If the determination of block 202 is "yes," then the cloning procedure is readied for an initiation request by the user in block 204. The request can come, for example, by the GUI 196 providing a push button or some other similar input device that the user activates to initiate the cloning procedure.

In block 206 an operating system is loaded and initialized to control the data transfer steps of the cloning procedure. The operating system can reside in the master SSD 156 or anywhere else, either internal or external to the enclosure 100*b*. Once the operating system is ready, data transfer operations from $SSD_1$ to $SSD_2$ begin in block 208. In successful reductions to practice a data transfer rate exceeding 2800 megabytes/second was achieved by combining a Thunderbolt® external connector on the SSD interface with PCIe Gen 4 SSDs.

Block 210 tracks whether a predetermined incremental milestone has been achieved as the cloning procedure progresses. If the determination of block 210 is "yes," then the GUI 196 can be used to inform the user in block 212. For example, without limitation, the GUI 196 can include display lights that are sequentially illuminated to inform the user that the cloning procedure is 25% complete when one of the lights is illuminated, then 50% complete when two of the lights are illuminated, then 75% when three of the lights are illuminated, and then 100% complete when four lights are illuminated.

Figure 11:
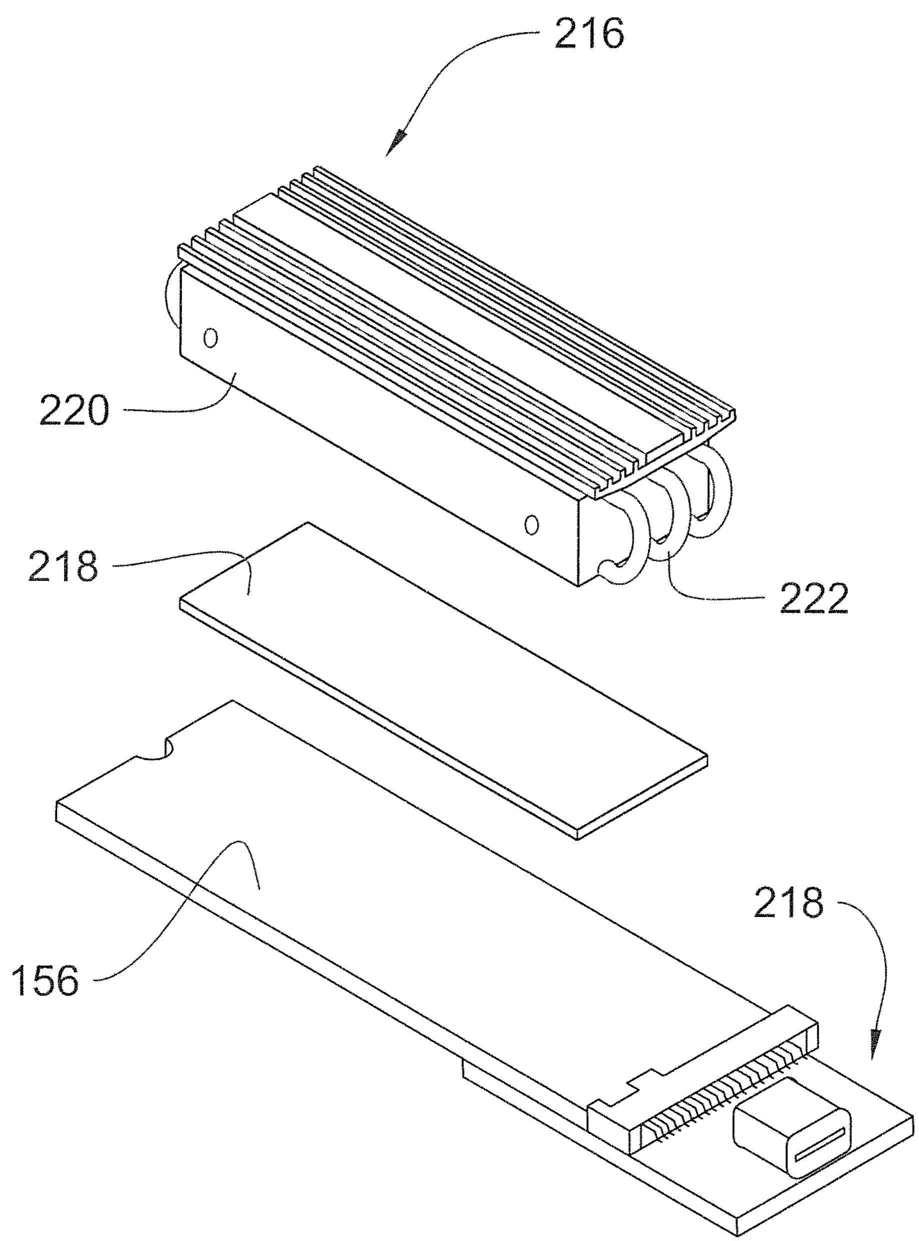
FIG. 11 is an isometric depiction of a heat sink apparatus constructed in accordance with illustrative embodiments of the present technology.
Figure 12A:
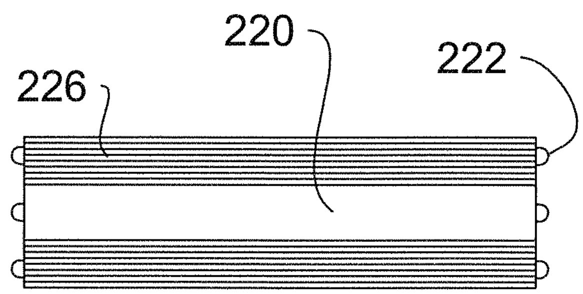
FIGS. 12A-12D depict top, front, bottom, and end view of the heat sink apparatus of FIG. 9.
Figure 12B:
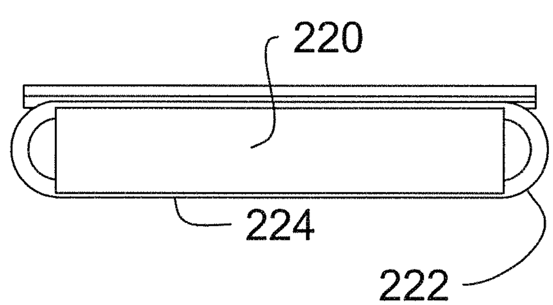
Figure 12D:
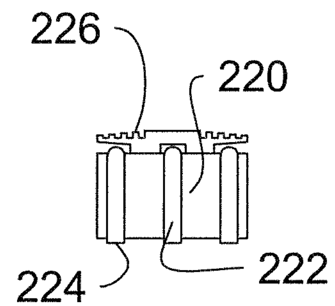
Figure 12C:
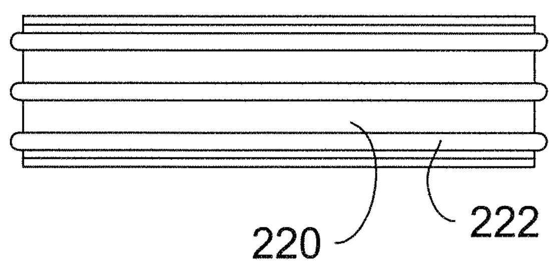

FIG. 11 is an isometric depiction of illustrative embodiments of an alternative protective enclosure of this technology, integrally forming a heat sink device 216 that can advantageously be employed to reduce the operating temperature of the electronics components, such the SSD 156. FIGS. 12A-D depict top, side, bottom, and end views of the heat sink 216 in these illustrative embodiments. The heat sink 216 is preferably placed on the SSD 156 with a thermal interface material ("TIM") 218 sandwiched therebetween to enhance the thermal conductivity between them.

The heat sink 216 is generally constructed of an aluminum body 220 that supports a number of copper coils 222. Copper has superior heat transfer performance, but it is significantly more expensive than aluminum. This combined use of copper and aluminum provides a heat sink with high performance heat transfer but at a competitive cost. The copper coils 222 extend slightly beyond the aluminum body 220, and have flattened bottom surfaces 224 to increase the contact area, and hence the thermal uptake, by the copper components. Heat from the SSD 156 is transferred via conduction into the copper coils 222, which in turn transfers the heat via conduction into the aluminum body 220. A number of fins 226 are formed in the aluminum body 220 to increase the surface area over which the heat is transferred to the surrounding environment via convection.

The various features and alternative details of construction of the apparatuses described herein for the practice of the present technology will readily occur to the skilled artisan in view of the foregoing discussion, and it is to be understood that even though numerous characteristics and advantages of various embodiments of the present technology have been set forth in the foregoing description, together with details of the structure and function of various embodiments of the technology, this detailed description is illustrative only, and changes may be made in detail, especially in matters of structure and arrangements of parts within the principles of the present technology to the full extent indicated by the broad general meaning of the terms in which the appended claims are expressed.

What is claimed:

1. An enclosure apparatus for a solid-state device (SSD), the apparatus comprising:

a rigid case having a wall defining an internal cavity, and a surface in the wall defining one of a first recess or a protuberant tab exposed to the internal cavity;

a cover configured to connect with the case in a closed position of the enclosure in which the cover and the case are connected together to cooperatively enclose the internal cavity, the cover defining the other of the first recess or the tab, the tab having a distal end that is selectively insertable into and retractable from the first recess in opposing sliding relationships of the tab and first recess, forming a reuseable articulable joint connecting the cover and the case together in the closed position of the enclosure and disconnecting the cover from the case in an open position of the enclosure; and a latch having a cam that is selectively movable between an extended position and a retracted position relative to a second recess defined by the wall, wherein the cam extended into the second recess connects the cover and the case together, and wherein the cam retracted out of the second recess disconnects the cover and case from each other.

2. The apparatus of claim 1 wherein the cam is supported by a shaft that is journaled for rotation by the cover.

3. The apparatus of claim 2 comprising a handle accessible to a user on an exterior surface of the cover and attached to the shaft so that the user rotating the handle imparts rotation to the shaft and cam.

4. The apparatus of claim 1 wherein the cover and the case are connected together by a removable fastener.

5. The apparatus of claim 4 further comprising a seal adhered to the enclosure over the removable fastener, preventing external access to the removable fastener without first compromising the seal's adhesion to the enclosure.

6. The apparatus of claim 1 wherein the SSD is a solid state drive comprising a flash memory and a communications interface configured for transferring digital data according to a peripheral component interconnect express (PCIe) protocol.

7. The apparatus of claim 6 wherein the solid state drive further comprises an M.2 form factor.

8. An enclosure apparatus for a solid-state device (SSD) including an interface component that has a printed circuit board assembly and an internal electronics connector configured for connecting to a memory device, the apparatus comprising: a rigid case having a wall defining an internal cavity, first surfaces forming the internal cavity that define one of a recess or a protuberant tab, and second surfaces forming the internal cavity that define a mounting feature for the SSD, wherein the mounting feature comprises third surfaces forming a recess exposed to the internal cavity and configured in a close mating relationship to a peripheral shape of the printed circuit board assembly, and wherein the mounting feature comprises fourth surfaces forming a first anchor point for a magnetic fastener operably retaining a distal end of the memory device opposite the internal electronics connector, the fourth surfaces further forming a second anchor point for the magnetic fastener operably retaining a distal end of a differently-sized second memory device opposite the internal electronics connector; and a cover configured to connect with the case in a closed position of the enclosure in which the cover and the case are connected together to cooperatively enclose the internal cavity, the cover having the other of the recess or tab, the tab having a distal end that is selectively insertable into and retractable from the recess in opposing sliding relationships of the tab and recess, forming a reuseable articulable joint connecting the cover and the case together in the closed position of the enclosure and disconnecting the cover from the case in an open position of the enclosure.

9. The apparatus of claim 8 further comprising a ferromagnetic member interposed between the fastener and the case.

10. An enclosure apparatus for a solid-state device (SSD), the apparatus comprising:

a rigid case having a wall defining an internal cavity, and a surface in the wall defining one of a recess or a protuberant tab exposed to the internal cavity;

a cover configured to connect with the case in a closed position of the enclosure in which the cover and the case are connected together to cooperatively enclose the internal cavity, the cover defining the other of the recess or the tab, the tab having a distal end that is selectively insertable into and retractable from the recess in opposing sliding relationships of the tab and recess, forming a reuseable articulable joint connecting the cover and the case together in the closed position of the enclosure and disconnecting the cover from the case in an open position of the enclosure;

a removable fastener configured to connect the cover and the case together; and a seal adhered to the enclosure over the removable fastener, preventing external access to the removable fastener without first compromising the seal's adhesion to the enclosure.

* * * * *